United States Patent [19]
Millham

[11] Patent Number: 4,855,681
[45] Date of Patent: Aug. 8, 1989

[54] TIMING GENERATOR FOR GENERATING A MULTIPLICTY OF TIMING SIGNALS HAVING SELECTABLE PULSE POSITIONS

[75] Inventor: Ernest H. Millham, Catlett, Va.

[73] Assignee: International Business Machines Corporation, Armonk, N.Y.

[21] Appl. No.: 59,647

[22] Filed: Jun. 8, 1987

[51] Int. Cl.$^4$ .................. G01R 31/28; G06F 11/00
[52] U.S. Cl. .................................. 328/62; 328/75; 371/27; 324/73 R; 377/26; 307/463
[58] Field of Search .................... 371/15, 27, 25; 324/73 R; 328/75, 63, 137, 118, 62, 59; 307/269, 529, 463; 377/33, 26, 51, 37

[56] References Cited

U.S. PATENT DOCUMENTS

| | | | |
|---|---|---|---|
| 3,781,829 | 12/1973 | Singh | 371/27 |
| 3,873,818 | 3/1975 | Barnard | 371/27 |
| 4,070,565 | 6/1978 | Borrelli | 371/27 |
| 4,102,491 | 7/1978 | De Vito et al. | 371/27 |
| 4,125,763 | 11/1978 | Drabing et al. | 324/73 R |
| 4,168,527 | 9/1979 | Winkler | 324/73 R |
| 4,216,374 | 8/1980 | Lam et al. | 371/27 |
| 4,222,514 | 9/1980 | Bass | 371/27 |
| 4,247,941 | 1/1981 | Raymond | 371/15 |
| 4,263,669 | 4/1981 | Staiger | 371/27 |
| 4,283,620 | 8/1981 | Drescher et al. | 371/27 |
| 4,293,950 | 10/1981 | Shimizu et al. | 371/25 |
| 4,365,333 | 12/1982 | Mulvey | 371/27 |
| 4,388,719 | 6/1983 | Soltysik et al. | 371/27 |
| 4,389,614 | 6/1983 | Staiger | 328/61 |
| 4,402,081 | 8/1983 | Ichimiya et al. | 371/21 |
| 4,423,380 | 12/1983 | Pileri | 324/73 R |
| 4,450,560 | 5/1984 | Conner | 371/25 |
| 4,571,724 | 2/1986 | Belmondo et al. | 371/27 |
| 4,713,623 | 12/1987 | Mower et al. | 307/269 |

OTHER PUBLICATIONS

Bansal, "Simultaneous Compare of Multi-Test Pattern Result . . . "IBM Tech. Bulletin, vol. 26, No. 2, Jul. 1983, p. 744.

Belyea, "Bit Programmable Pattern Generator", IBM Tech. Bulletin, vol. 21, No. 3, Aug. 1978, pp. 897-901.

Primary Examiner—John S. Heyman
Assistant Examiner—Timothy P. Callahan
Attorney, Agent, or Firm—Pollock, Vande Sande & Priddy

[57] ABSTRACT

A timing generator for generating a plurality of pulse sequences within a test cycle. Each pulse sequence has a plurality of pulses having a position identified by the data contents of a multiplicity of random access memories. Like numbered lower order bits of each memory are decoded to provided a plurality of pulse sequences corresponding in number to the number of lower order bits. The memories are arranged in a hierarchy. The random access memories are each provided with a separate address counter. The highest order bit of each memory is used to reset the respective memory address counter as well as enable an adjacent higher order memory address counter, and are decoded to define the end of the test cycle.

15 Claims, 3 Drawing Sheets

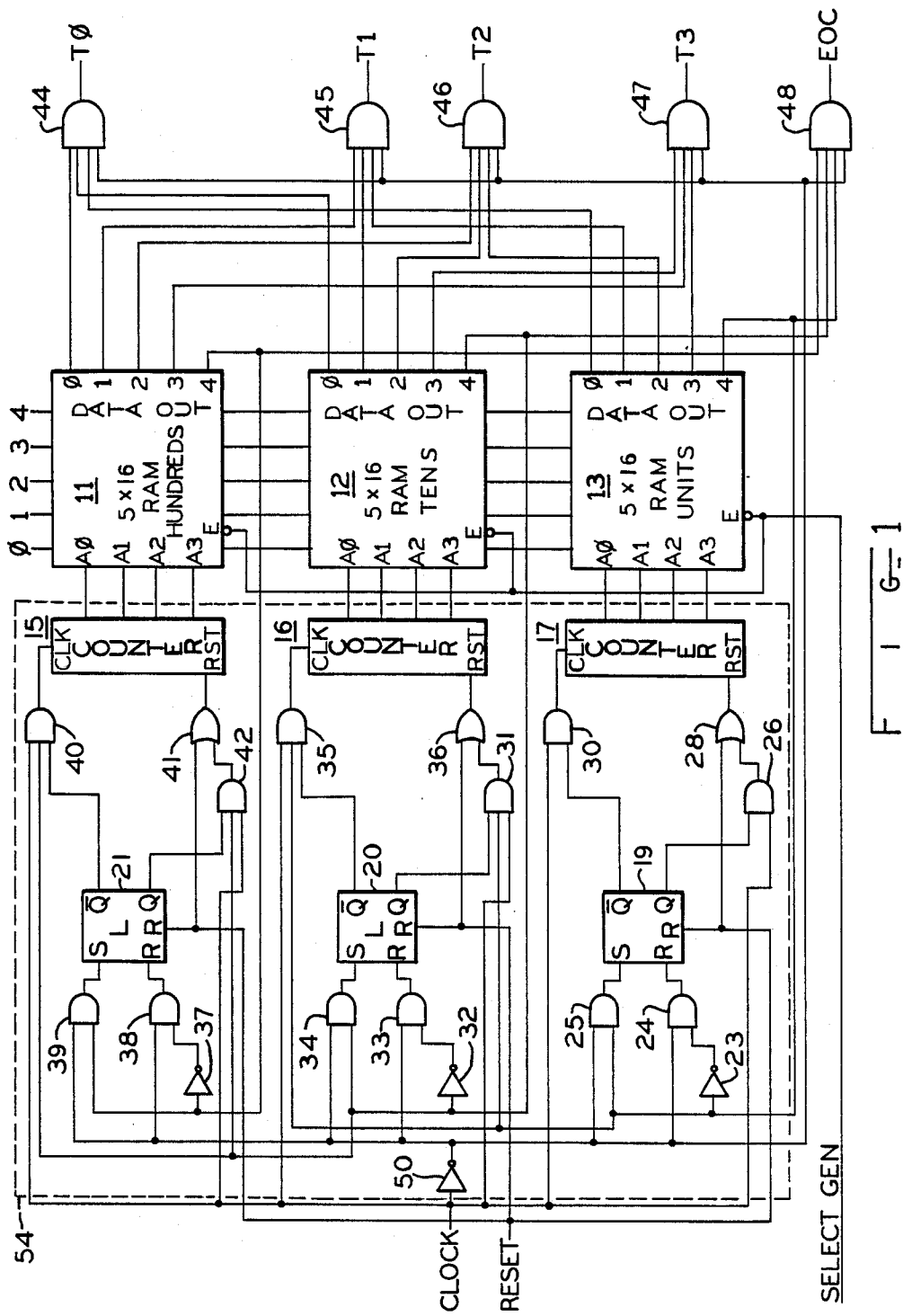

TIMING GENERATOR FOR GENERATING A MULTIPLICTY OF TIMING SIGNALS HAVING SELECTABLE PULSE POSITIONS

BACKGROUND OF THE INVENTION

The present invention relates to the testing of large scale integrated circuits. Specifically, a programmable timing generator is described, capable of generating a plurality of pulse signals having selectable pulse positions.

Automatic high-speed testing devices have been developed to test large-scale integrated circuits on an automatic basis. Typically, a large scale integrated circuit made from the MECL bipolar technology would include 10,000 bipolar gates which are to be tested in order to verify the circuit's operation. These testing devices generally include pin electronic circuitry which provides driving pulses for each pin of the circuit under test, as well as detects responses from other pins under test. Under control of a master program, the automatic tester will exercise the pins by supplying a different sequence of pulses to a plurality of pins, each sequence timed with respect to each other. The response of the electronic circuit to these sequences of pulses is measured by the pin electronics.

These automatic testing devices are organized on the basis of test cycles for a group of pins of the circuit under test. Typically, one test cycle for a given pin of an electronic circuit under test is exercised, followed by subsequent test cycles. These test cycles include applying a plurality of sequential test pulses to a set of pins timed with respect to each other and to a system clock. Once a test cycle, typically in the 40 nanosecond range, is completed, a subsequent test cycle must be effected.

In the prior art, a typical technique for generating the required pulses for the pin electronics is accomplished by decoding a clock driven counter with a register and exclusive OR circuitry. These dedicated counter circuits and decoding circuitry do not lend themselves to providing the multiplicity of pulse combinations necessary to completely test an integrated circuit having state of the art device density. Also, some of the architecture involved in generating the required timing signals limits the accuracy of pulse generation, thus limiting the capabilities of effective testing of the large-scale integrated circuit.

SUMMARY OF THE INVENTION

It is an object of this invention to provide a programmable timing generator for providing a plurality of test pulse sequences to an integrated circuit tester.

It is a more specific object of this invention to provide a multiplicity of timing signals which are not limited in length and which are independent of each other.

These and other objects of the invention are provided by a timing generator which is capable of producing at least 4 precisely timed independent pulse sequences for a given pin of an integrated circuit which is to be tested. The timing pulses of each sequence have a unique programmable position within a test cycle. The timing pulses may be accurately trimmed to less than a 1 NS position accuracy of a testing cycle. Multiplexing several timing generators increases the pulse position diversity which is available for each pin.

In carrying out the invention, at least two dynamic random access memories (hereinafter RAMs) are provided for storing data identifying the position of each pulse in a plurality of pulse sequences, constituting a complete test cycle. The memory locations of each RAM include a multibit binary number produced on ordered multiple bit outputs of the RAM when each memory location is addressed. Like bit numbers of each of the lower order bit outputs of the RAMs are decoded to generate each pulse sequence. For N lower order bit outputs there will be N pulse sequences.

The test cycle is constituted by a number of clock periods. The multiple RAMs are arranged in a hierarchy to divide the test cycle into intervals permitting the position of each pulse of each sequence to be identified to within one clock period.

The RAMs each have their own address counter which is reset to a starting address at the beginning of the test cycle by a command. The first RAM address counter will be enabled to count clock pulses at the initiation of a test cycle during a fractional portion of the test cycle. A binary 1 is programmed in the highest order bit position of a memory location having an address corresponding to the number of clock periods in the fractional portion of the test cycle. This highest order bit position is decoded and used to reset the address counter. Thus, the first RAM will be cyclically addressed between a starting address and the address location containing a binary 1 in the highest order bit position.

The second RAM identifies the position of each pulse in each pulse sequence for a remaining portion of the test cycle. The address counter is enabled to count a clock pulse each time the first RAM address counter is reset. The second RAM also include a binary 1 at a predetermined memory location in the highest order bit position, which resets the address counter of the second RAM. Thus, the memory counter of the second RAM will be read out between the starting address and an address containing the preprogrammed binary 1.

An END OF TEST CYCLE signal is produced when the highest order bit output of all the RAMs is at a binary 1 output.

In the preferred embodiment, three dynamic RAMs having a 5 bit wide output are provided, and the 5th highest order bit is used to reset its address counter. Additionally, the RAMs are ordered in a hierarchy such that the lowest order RAM 5th bit will enable the next adjacent RAM address counter to count one clock pulse. The remaining RAM address counter is likewise connected to count a clock pulse when the 5th bit of the next adjacent RAM undergoes a transition. When the 5th bit of the three RAMs are at a common state, the END OF TEST CYCLE is identified.

The timing generators may be multiplexed together to provide even greater pulse diversity wherein external testing apparatus may select a different timing generator for four more additional pulse sequences.

DESCRIPTION OF THE FIGURES

FIG. 1 illustrates one embodiment of a timing generating in accordance with the present invention.

DESCRIPTION OF THE PREFERRED EMBODIMENT

Figure 2A:
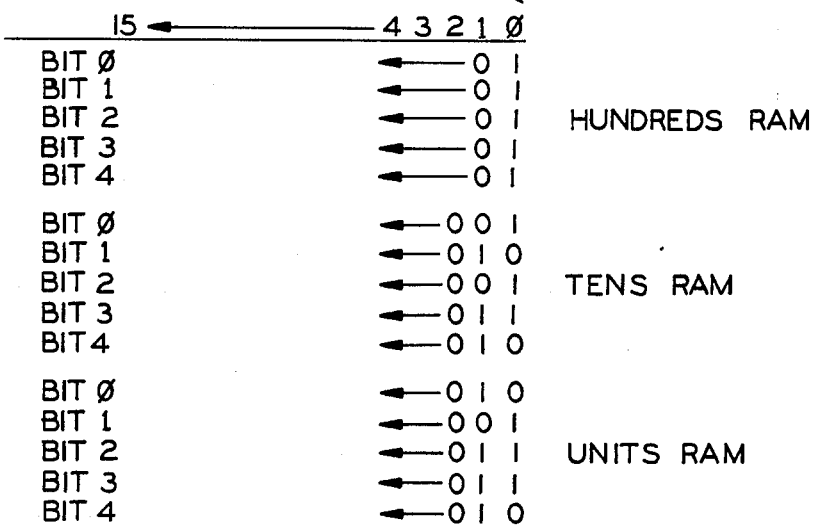
FIG. 2 is an illustration of the relationship between the memory's data contents and the pulse generation capability of the timing generator.

Referring now to FIG. 1, there is shown one of a plurality of timing generators which may be selected to supply four distinct timing pulse sequences. The individual timing generator of FIG. 1 provides independent pulse sequences identified as T0, T1, T2 and T3 over a test cycle. At the end of a test cycle, an end of cycle (EOC) signal is generated.

The four timing pulse sequences are generated from decoding like order output bits of three 5×16 random access memories (RAM) 11, 12 and 13. The lowest order bit output of each RAM is decoded in an AND gate 44 to provide the pulse stream T0. Similarly, the first order bits are decoded with AND gate 45 to derive pulse sequence T1, as well as the second and third order bits decoded in AND gates 46 and 47 to derive pulse sequences T2 and T3. The end of the test cycle is determined with AND gate 48 decoding the highest order bit of each of the RAMs 11, 12 and 13.

The position of each pulse in the pulse sequences T0, T1, T2 and T3 with respect to the input clock signal is determined by the stored data contents of the RAMs 11, 12, and 13. During operation, a reset pulse is supplied to the timing generator, through OR gates 28, 36 and 41, marking the beginning of a test cycle, which resets flip flops 19, 20 and 21 and each address counter 15, 16 and 17 to address 0, 0, 0, 0. The first of the counters 17, referred to as a units counter, will subsequently count clock pulses applied to AND gate 30. AND gate 30 is enabled by the SR flip flop 19. Flip flop 19 is held in the reset condition by inverter 23 and AND gate 24 when the highest order bit of RAM 13 is low.

Each address counted by counter 17 will provide an output on the data output lines A0 through A3. When counter 17 has addressed a word contained in RAM 13 having the highest order bit at logic 1, the flip flop 19 is set when the inverted clock signal from inverter 50 goes high by AND gate 25, disabling further counting by the counter 17. Additionally, SR flip flop 19 will have the Q output toggled high, resetting counter 17 through AND gate 26 to its initial count which, in this example, is 0, 0, 0, 0. At the same time, the higher order bit will enable AND gate 35 and permit counter 16 to increment upon receipt of the next clock pulse and address the adjacent RAM 12 at the next consecutive storage location. The reset of counter 17 will produce at the output of RAM 13, a zero in the 4th bit position, resetting SR flip-flop 19 through inverter 23 and AND gate 24.

The appearance of a 1 bit on the highest order bit output of RAM 13 will enable AND gate 35, and counter 16 will count one clock pulse. Each time the highest order bit of the units RAM 13 goes high, the address counter 16 will increment by one count. Once the tens RAM 12 produces a binary 1 bit on its highest order bit output, SR flip flop 20 will be set by AND gate 34. The next occurrence of a binary 1 from the highest order bit of RAM 13, during a following cycle of counter 17, will enable AND gate 31 to reset counter 16. The highest order bit of RAM 13 will go to zero, resetting SR flip-flop 20 through AND gate 33 and inverter 32 when the inverted clock signal from inverter 50 goes high.

The remaining higher order RAM 11 includes an address counter 15 which counts a clock pulse each time the tens RAM 12 highest order output bit is a logic 1. AND gate 42 and OR gate 41 will reset the counter 15 each time the tens RAM 12 produces a logic 1 on the highest order bit 4. Additionally, counter 15 is incremented at this time by enabling AND gate 40. Once the RAM 11 has been addressed to a memory location having a 1 at the highest order bit 4, flip flop 21 is set by AND gate 39 when the inverter 50 indicates the clock pulse transition is complete. The counter 15 is reset to begin counting again after the highest order bit from tens RAM 12 in the next cycle of address counter 16 enables AND gate 42. AND gate 38 and inverter 37 will reset SR flip-flop 21 when the highest order bit of RAM 11 goes to zero.

By programming a binary one bit in the 4th bit position of the memory location identified by the 10th address, the RAM 13 becomes a units RAM identifying the pulse positions within an increment of 10 clock cycles. The RAM 12 becomes a tens RAM by placing a binary 1 bit in the 4th bit position of the memory location at address 10 and identifies the pulse position for 100 clock cycles, and RAM 11 becomes a hundred RAM programming a binary 1 in the 4th bit position of address 10, specifying the pulse positions for a test cycle of 1000 clock cycles. Each of the RAMs contains data which will specify a location of a pulse for each of the sequences of pulses T0, T1, T2 and T3. The test cycle may be defined in terms of a number of clock pulses beginning with a reset pulse applied to the SR flip flops 19, 20, 21 and ending with an EOC signal which results when the highest order bit of each RAM 11, 12, 13 simultaneously assume a binary 1. The tens and hundreds RAMs 11, 12 identify the position of pulse which occur in a test cycle increments of 100 and 1000 clock pulses, whereas the units RAM 13 further resolves the position of the pulses between these intervals.

Figure 2B:
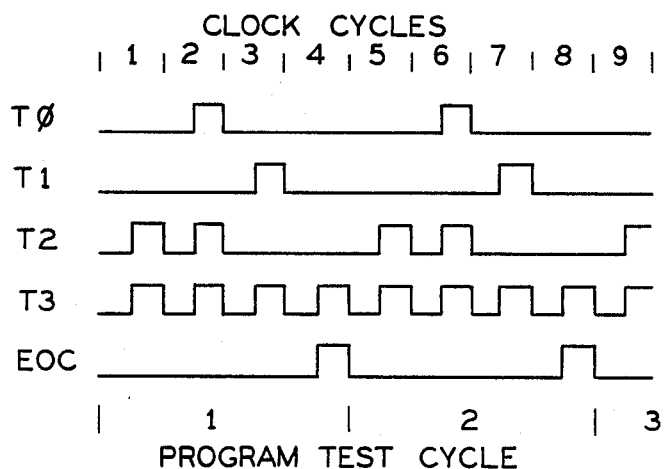

A simple example of the programming of the RAMs 11, 12, 13 for a program test cycle comprising four clock cycles is shown in FIG. 2. FIG. 2 illustrates the memory contents necessary to provide the shown test pulses T0, T1, T2 and T3. The data contained in each of the RAMs for addresses 0, 1 and 2 are shown in FIG. 2. The program test cycle is small enough that the hundreds RAM 11 is not needed, and each of the pulse positions for T0, T1, T2 and T3 can be specified, utilizing only the units RAM 13 and tens RAM 12. The hundreds RAM 11 contains the data 1111 at address 0000, and data 0000 at all other addresses.

As can be seen from FIG. 2, address 0 will produce a 1 output on bit numbers 1, 2, 3 of the units RAM 13 as well as bits 0, 2 and 3 of the tens RAM 12. AND gates 46 and 47 will decode the 1 bits appearing at address 0 to provide a pulse during the first clock cycle on T2 and T3. During the second address 1, AND gate 44 provides a pulse T0, and AND gates 46 and 47 provide T2 and T3. Bit 4 of the units RAM is a 1 when the address is indexed to the second memory location. Thus, the tens RAM 13 will be incremented to its second address (1) during clock cycle 3. Thus, for clock cycle 3, a pulse at T1 is produced as well as at T3. By placing a 1 in the highest order bit of the units RAM 13 address number 2, it is possible to cycle the units RAM between two addresses which increment the tens RAM every two clock pulses. After the units address has changed four times, a 1 bit appears in the units RAM 13 highest order bit output, as well as in the tens RAM 12 highest order bit output. Thus, an END OF TEST cycle is generated as the hundreds RAM 11 has a 1 bit in bit 4. The highest order bits from each of the tens and units RAMs also resets the respective address counters 16 and 17 by setting flip flops 19 and 20.

The foregoing simplified example demonstrates the use of three RAMs to specify the position of pulses for four different timing pulse sequences. Each of these timing pulse sequences may be applied to pin electronics for providing a drive signal to each pin of a circuit under test. Additionally, each of these pulse sequences may be delayed by a smaller incremental delay to adjust for errors in clock cycle frequency, thereby more accurately positioning the location of each pulse sequence.

A general set of rules not applicable to the foregoing example, but useful for more typical test pulse requirements may be used for selecting the data for storage in each of the RAMs 11, 12 and 13. If the test cycle as defined by the EOC period as measured in clock pulses is less than 16 clock pulses, then bit number 4 for the units RAM may be set at binary 1 for an address $U_s$ equal to the EOC period as measured in clock pulses. In the event the test cycle as measured in clock pulses exceeds 16, then the fourth bit is set to binary 1 at address ($U_s$) equal to 16, the maximum address count in the memory.

The address location $T_s$ of the 4th bit which contains a binary 1 for the tens RAM 11 may be determined using the same observations. If less than 256 clock pulses define the EOC period, then the 4th bit is made binary 1 at address locations $T_s$ defined by the truncated value of $$\frac{\text{EOC period in clock pulses}}{\text{Address } U_s}$$

Where the clock period is greater than 256 clock pulses, the 4th bit at address 16 is programmed with a binary 1.

For EOC periods beyond 256 clock pulses, the 4th bit is set to 1 at an address location $T_H$ in the hundreds RAM identified by the truncated value of $$\frac{\text{EOC period in clock pulses}}{\text{Address } T_s}$$

The remaining memory locations may be programmed so that a single bit at a single address location defines the location of a pulse edge.

The address locations containing a single binary 1 are calculated for each of the pulses which make up pulse sequences T0, T1, T2, T3 up to Tr. These calculations are made for all memories. If the leading edge of a pulse of a sequence occurs less than 256 clock pulses, the hundreds memory receives a binary 1 at the bit position (0 1, 2 or 3) dedicated to the pulse, i.e., T0, T1, T2 or T3 at an address of 0000. If the leading edge of a pulse appears at a location greater than 256 clock pulses, a binary 1 is inserted at a bit position dedicated to the pulse at an address which equals $H_T$:

$$H_T = \frac{\text{No. of Clock Pulses Pulse Edge Occurs}}{256}$$

rounded to the next whole integer.

For pulses which occur in less than 256 clock pulses, the tens RAM address $T_E$ which contains a binary 1 is determined as:

$$\frac{\text{No. of Clock Pulses Where Pulse Edge Occurs}}{16}$$

Where pulses occur at a position greater than 256, the tens RAM memory address $T_T$ containing a binary 1 is determined as:

$$\frac{\text{No. of Clock Pulses Where Pulse Edge Occurs}}{16} - (H_T - 1) \times 16$$

The units memory addresses $U_t$ containing a binary 1 in the dedicated bit position for each pulse T0, T1, T2, T3 are determined as:

when $H_T, T_T = 1$, $U_t$ = No. of Clock Pulses Where Pulse Edge Occurs where $H_T = 1$, and $T_T = 1$, then $U_t$ = No. of Clock Pulses Where Edge Occurs −

$$(H_T - 1) \times 256 - T_T \times 16$$

where $H_T$ 1, then $U_t$ = No. of Clock Pulses Where Edge

Occurs − $((H_T - 1) \times 256 - T_T \times 16)$

Each of the foregoing calculations are completed for each pulse of each pulse sequence T0, T1, T2, T3 to determine the addresses of each memory to receive a binary 1 for each bit position. The data loaded at these addresses defines each pulse in the pulse sequences T0, T1, T2, T3 up to Tn.

Although the foregoing rules have been demonstrated with respect to the generation of four independently generated pulse sequences, it is obvious that memories having a wider output can be used to generate more pulse sequences. Additionally, the use of more memories permits the generation of longer cycles and more pulse per test cycle.

Figure 3:
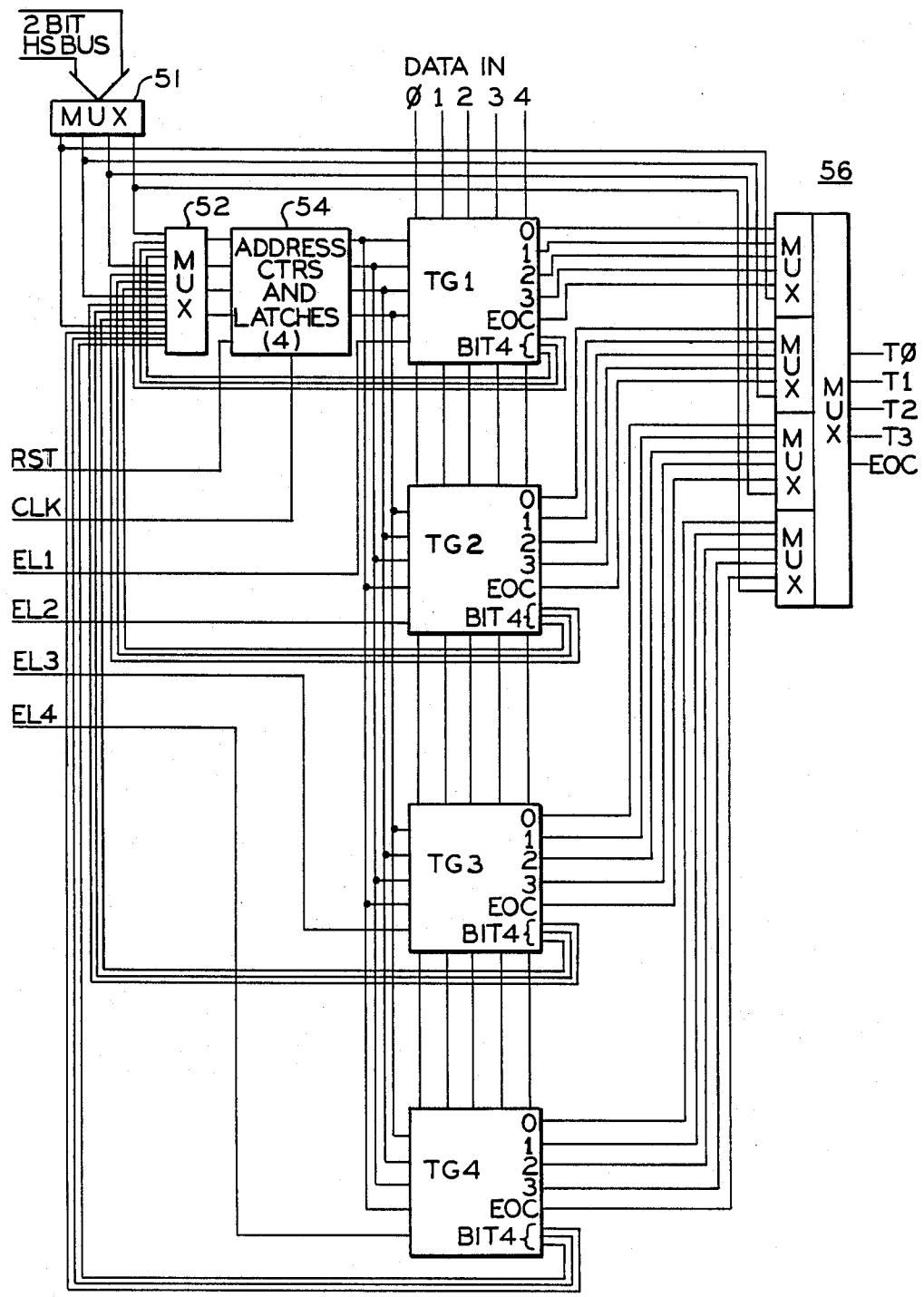
FIG. 3 demonstrates how each timing generator may be multiplexed to provide a selective test cycle.

Several of the foregoing timing generators may be multiplexed together as shown in FIG. 3. A first MUX 51 is used to identify which of the timing generators TG1, TG2, TG3 or TG4 is selected. The two bit data entered in MUX 51 will enable MUX 56 to provide one of the timing generator outputs to T0, T1, T2, T3 and EOC. Having multiplexed all the outputs of the timing generators TG1, TG2, TG3 and TG4 together in MUX 56, an output from any one of these timing generators may be selected upon supplying the correct two bit binary code to MUX 51.

Additionally, the counters and latches 54 of FIG. 1 may be shared between each timing generator, thus reducing the total hardware overhead necessary for multiplexing three timing generators. The counters and latches shown in the area designated 54 on FIG. 1, may be effectively multiplexed with MUX 52 such that the fourth bit of each RAM contained in each timing generator is multiplexed through MUX 52 to provide the reset of each flip flop 19, 20 and 21 of FIG. 1. Additionally, each of the counters 15, 16 and 17 are connected to address inputs of each respective memory of TG1, TG2, TG3 and TG4. Thus, upon selection of a timing generator by raising enables EL1, EL2, EL3 or EL4, one of the four timing generators may be enabled and the RAMs of the timing generator addressed by address counter 54.

In operation, four independent pulses T0, T1, T2 and T3 are provided to provide timing generators to the pin electronics of a large scale integrated circuit testing system. Selection of any one of the four shown timing generators may be done on the fly, by raising the appropriate enables EL1, EL2, EL3 and EL4. Thus, the program test cycle may be varied by selecting a different timing generator.

Thus, there has been described with respect to one embodiment, a timing generator which may be multiplexed with other similar timing generators to provide a multiplicity of test cycle pulses for timing purposes. Those skilled in the art will recognize yet other embodiments of the invention defined more particularly by the claims which follow.

Having thus described our invention, what I claim as new, and desire to secure by Letters Patent is:

1. An apparatus for generating a multiplicity of timing signals within a program cycle for enabling testing of a circuit component comprising:
    a source of periodic clock pulses for identifying an increment of a test cycle;
    a multiplicity of random access memories for storing at a plurality of addresses a plurality of multibit binary numbers, said memories producing in response to respective address inputs each bit of said stored binary numbers;
    a multiplicity of decoding gates, each gate connected to receive a like numbered bit from each of said memories as well as a clock pulse and producing a timing signal when a predetermined bit pattern is produced by said like-numbered bits;
    a multiplicity of counters connected to count said clock pulses, each of said counters connected to supply address signals to one of said memories, the highest order bit of one of said memories being connected to enable a counter of an adjacent memory and to reset a connected counter, whereby each time the contents of said connected memory are read out between a starting address and an address containing data in said highest order bit, an address input to an adjacent memory is incremented one address unit and a respective counter of said connected memory is reset; and
    an END OF CYCLE decoder having a plurality of inputs, each connected to one of said memories, which decode the contents of said memories to identify from said contents the end of a program cycle.

2. The timing apparatus of claim 1 wherein each of said counters comprises:
    a binary counter having a counting input and a reset input;
    a set-reset latch having a set input, reset input, Q and Q outputs; said Q and Q outputs each connected to enable said reset input and said counting input;
    a first gate means connected to enable said set input when a connected memory high order bit changes to a first state; and
    a second gate means connected to enable said reset input when said higher order bit changes from said first state to a second state.

3. The timing apparatus of claim 1 wherein said end of cycle decoder comprises an AND gate having multiple inputs connected to the highest order bit of each memory.

4. A timing generator for producing a plurality of pulse sequences comprising:
    a first memory connected to an address counter, said first memory including a plurality of storage locations which include a multibit binary number, the lower order bits of said binary number specifying the presence or absence of a pulse in a pulse sequence, the most significant bit of said binary number providing a reset of said address counter;
    a source of clock pulses for incrementing said address counter;
    a second memory connected to a second address counter, the second memory including a plurality of storage locations which include a multibit binary number, the lower order bits of said second memory specifying the location of a pulse in a pulse sequence, said second memory address counter being incremented to a new count by said clock pulses each time said first memory most significant bit changes state, and being reset when said second memory highest order bit changes state;
    a plurality of decoders, each decoder connected to decode a like numbered lower order bit of said first and second memory to form a single pulse stream; and
    an END OF CYCLE decoder connected to decode the highest order bit of each memory, whereby a common end of test cycle signal is generated.

5. The timing generator of claim 4 further comprising:
    a third memory connected to an third address counter, said third memory including a plurality of storage locations which include a multibit binary number, the lower order bits of said memory specifying the location of a pulse in a pulse sequence, said lower order bits connected to said plurality of decoders, whereby further pulses of each pulse sequence are identified, said third memory address counter being enabled to count said clock pulses each time said second memory higher order bit changes state, and being reset when said third memory highest order bit changes state.

6. The timing generator of claim 4 further comprising means for resetting said second memory address counter when said first memory highest order bit changes state following a change of state of said second memory highest order bit.

7. A timing generator comprising:
    a plurality of groups of random access memories, each group comprising an equal number of random access memories having multiple ordered outputs, each group of memories including a plurality of decoders, each decoder having a plurality of inputs connected to a like numbered bit output of each memory in said group;
    a multiplicity of address counters for separately addressing said equal number of random access memories;
    a multiplexer connected to each decoder to select output signals from one group f decoders associated with one group of memories;
    a second multiplexer connected to receive the highest order bit from each memory, and to apply a highest order output bit of a selected group of random access memories to a reset input of a respective counter addressing each of said memories, and to enable an input of an address counter of another memory of said group; and,
    mens connected to said multiplexers for simultaneously selecting a plurality of decoded outputs of a group of said random access memories as timing signals having a pulse sequence selected by programming said memories.

8. The timing generator of claim 7 wherein one of said decoders of each group of random access memories decodes the highest order output of each memory of a group to identify an end of test cycle.

9. The timing generator of claim 8 wherein each of said counters receives a reset signal marking the beginning of a test cycle.

10. The timing generator of claim 7 further comprising:
a source of clock pulses for incrementing said multiplicity of address counters; and an SR flip flop for enabling each of said counter to count said clock pulses, and for resetting said counter when the highest order bit of a connected memory changes state.

11. A method for generating a multiplicity of timing signals within a program cycle for testing circuit components comprising:
generating a plurality of random access memories a plurality of multibit binary numbers;
decoding like-numbered bit outputs in each of said random access memories along with each of said clock pulses, whereby each of said like-numbered bit outputs produce a timing signal when a predetermined bit pattern is produced by said like-numbered bit outputs;
addressing each of said memories with individual address counters which are incremented sequentially with said clock pulses;
enabling with the highest order bit output of one of said memories an address counter of an adjacent memory and resetting a connected counter which addresses said one memory, whereby each time the contents of said connected memory are read out between a starting address and an address location producing data on said highest order bit output, the address counter connected to said adjacent memory is incremented and said connected counter addressing said one memory is reset; and,
decoding an end of program cycle from said memories.

12. The method for generating timing signals according to claim 11 wherein said like-numbered bit outputs equal four.

13. The method of claim 11 wherein said end of program cycle is generated by decoding the highest order bit of each memory.

14. A method for generating timing signals within a program cycle for testing a circuit component comprising:
storing data in a plurality of memories identifying the pulse sequence of a plurality of timing signals, said memories providing a plurality of like-ordered bit outputs;
decoding each of said like-ordered bit outputs from said memories to form a plurality of timing signals;
generating periodic clock pulses;
addressing a first of said memories with an address counter which is incremented by said periodic clock pulses;
addressing a second of said memories with a second address counter which is incremented by said clock pulses;
resetting said first counter and enabling said second address counter to count a clock pulse each time said first memory highest order bit output produces data, whereby each time the contents of said first memory are read out between a starting address and an address producing data on said highest order bit output of said memory, said second memory address counter is incremented; and,
generating an end of program cycle signal when said one of said like-ordered bit outputs produces a predetermined binary number.

15. The method of claim 14 further comprising:
addressing a third of said memories with a third address counter which is incremented by said clock pulses and enabled for incrementing when said second memory highest order bit output produces data; and,
resetting said second address counter each time said second memory highest order bit output produces data.

* * * * *

UNITED STATES PATENT AND TRADEMARK OFFICE
CERTIFICATE OF CORRECTION

PATENT NO. : 4,855,681            Page 1 of 2

DATED : August 8, 1989

INVENTOR(S) : Millham

It is certified that error appears in the above-identified patent and that said Letters Patent is hereby corrected as shown below:

In column 7, line 55, "Q" (first occurrence) to --$\overline{Q}$--.

Please delete claim 11 in columns 9/10 and insert as follows:

--11. A method for generating a multiplicity of timing signals within a program cycle for testing circuit components comprising:

generating a plurality of periodic clock pulses identifying an increment of a test cycle;

storing in a plurality of random access memories a plurality of multibit binary numbers;

decoding like-numbered bit outputs in each of said random access memories along with each of said clock pulses, whereby each of said like-numbered bit outputs produce a timing signal when a predetermined bit pattern is produced by said like-numbered bit outputs;

addressing each of said memories with individual address counters which are incremented sequentially with said clock pulses;

UNITED STATES PATENT AND TRADEMARK OFFICE
CERTIFICATE OF CORRECTION

PATENT NO. :   4,855,681                                Page 2 of 2

DATED      :   August 8, 1989

INVENTOR(S) :  Millham

It is certified that error appears in the above-identified patent and that said Letters Patent is hereby corrected as shown below:

enabling with the highest order bit output of one of said memories an address counter of an adjacent memory and resetting a connected counter which addresses said one memory, whereby each time the contents of said connected memory are read out between a starting address and an address location producing data on said highest order bit output, the address counter connected to said adjacent memory is incremented and said connected counter addressing said one memory is reset; and, decoding an end of program cycle from said memories.

Signed and Sealed this

Twelfth Day of February, 1991

*Attest:*

HARRY F. MANBECK, JR.

*Attesting Officer*      *Commissioner of Patents and Trademarks*

UNITED STATES PATENT AND TRADEMARK OFFICE
CERTIFICATE OF CORRECTION

PATENT NO. : 4,855,681

DATED : August 8, 1989

INVENTOR(S) : Millham

It is certified that error appears in the above-identified patent and that said Letters Patent is hereby corrected as shown below:

Col. 2, lines 62-63 "generating" should be --generator--

Col. 7, line 55, "Q" (third occurrence) should be --$\overline{Q}$--

Col. 8, line 29, "an" should be --9-- line 58 "f" should be --of-- line 67, "mens" should be --means--

Col. 9, line 16, "counter" should be --counters--

Signed and Sealed this

Twenty-third Day of April, 1991

Attest:

HARRY F. MANBECK, JR.

*Attesting Officer*      *Commissioner of Patents and Trademarks*